United States Patent
Chen et al.

(10) Patent No.: US 11,855,219 B2
(45) Date of Patent: Dec. 26, 2023

(54) PASSIVATED AND FACETED FOR FIN FIELD EFFECT TRANSISTOR

(71) Applicant: Taiwan Semiconductor Manufacturing Co., Ltd., Hsinchu (TW)

(72) Inventors: Yen-Yu Chen, Taipei (TW); Chi-Yuan Shih, Hsinchu (TW); Chi-Wen Liu, Hsinchu (TW)

(73) Assignee: Taiwan Semiconductor Manufacturing Company, Ltd, Hsin-Chu (TW)

( * ) Notice: Subject to any disclaimer, the term of this patent is extended or adjusted under 35 U.S.C. 154(b) by 256 days.

(21) Appl. No.: 17/509,220

(22) Filed: Oct. 25, 2021

(65) Prior Publication Data

US 2022/0045214 A1    Feb. 10, 2022

Related U.S. Application Data

(60) Continuation of application No. 16/538,496, filed on Aug. 12, 2019, now Pat. No. 11,158,743, which is a continuation of application No. 15/620,499, filed on Jun. 12, 2017, now Pat. No. 10,381,482, which is a continuation of application No. 15/018,245, filed on
(Continued)

(51) Int. Cl.
| | |
|---|---|
| *H01L 29/66* | (2006.01) |
| *H01L 29/78* | (2006.01) |
| *H01L 21/8234* | (2006.01) |
| *H01L 27/088* | (2006.01) |
| *H01L 29/165* | (2006.01) |
| *H01L 23/29* | (2006.01) |
| *H01L 23/31* | (2006.01) |

(Continued)

(52) U.S. Cl.
CPC .. *H01L 29/7851* (2013.01); *H01L 21/823431* (2013.01); *H01L 21/823481* (2013.01); *H01L 23/291* (2013.01); *H01L 23/3171* (2013.01); *H01L 27/0886* (2013.01); *H01L 29/0649* (2013.01); *H01L 29/1054* (2013.01); *H01L 29/165* (2013.01); *H01L 29/66795* (2013.01); *H01L 29/66818* (2013.01); *H01L 29/785* (2013.01); *H01L 29/7853* (2013.01); *H01L 29/7854* (2013.01); *H01L 2924/0002* (2013.01)

(58) Field of Classification Search
CPC .................. H01L 29/66818; H01L 29/66795
See application file for complete search history.

(56) References Cited

U.S. PATENT DOCUMENTS

| 6,475,869 B1 | 11/2002 | Yu |
| 8,519,481 B2 | 8/2013 | Yuan et al. |

(Continued)

FOREIGN PATENT DOCUMENTS

| CN | 1645629 A | 7/2005 |
| CN | 101924133 A | 12/2010 |

(Continued)

*Primary Examiner* — Grant S Withers
(74) *Attorney, Agent, or Firm* — Slater Matsil, LLP

(57) ABSTRACT

A fin field effect transistor (FinFET), and a method of forming, is provided. The FinFET has a fin having one or more semiconductor layers epitaxially grown on a substrate. A first passivation layer is formed over the fins, and isolation regions are formed between the fins. An upper portion of the fins are reshaped and a second passivation layer is formed over the reshaped portion. Thereafter, a gate structure may be formed over the fins and source/drain regions may be formed.

20 Claims, 10 Drawing Sheets

Related U.S. Application Data

Feb. 8, 2016, now Pat. No. 9,680,021, which is a division of application No. 14/051,033, filed on Oct. 10, 2013, now Pat. No. 9,287,262.

(51) Int. Cl.
*H01L 29/06* (2006.01)
*H01L 29/10* (2006.01)

(56) References Cited

U.S. PATENT DOCUMENTS

| | | |
|---|---|---|
| 8,883,585 B1 | 11/2014 | Fumitake |
| 8,889,500 B1 | 11/2014 | Kamineni et al. |
| 8,952,420 B1 | 2/2015 | Loubet et al. |
| 9,219,115 B2 | 12/2015 | Colinge |
| 2003/0173641 A1 | 9/2003 | Ohta et al. |
| 2004/0219722 A1 | 11/2004 | Pham et al. |
| 2005/0145932 A1 | 7/2005 | Park et al. |
| 2005/0156202 A1 | 7/2005 | Rhee et al. |
| 2005/0158934 A1 | 7/2005 | Yun et al. |
| 2005/0173768 A1 | 8/2005 | Lee et al. |
| 2006/0118876 A1 | 6/2006 | Lee et al. |
| 2006/0189058 A1 | 8/2006 | Lee et al. |
| 2007/0048934 A1 | 3/2007 | Kim et al. |
| 2007/0158764 A1 | 7/2007 | Orlowski et al. |
| 2007/0167024 A1 | 7/2007 | Li et al. |
| 2008/0135888 A1 | 6/2008 | Lee et al. |
| 2008/0296648 A1 | 12/2008 | Zhu |
| 2010/0052043 A1 | 3/2010 | Lee |
| 2010/0258870 A1 | 10/2010 | Hsu et al. |
| 2011/0073952 A1 | 3/2011 | Kwok et al. |
| 2011/0074340 A1 | 3/2011 | Kao |
| 2011/0081764 A1 | 4/2011 | Maszara et al. |
| 2011/0084340 A1 | 4/2011 | Yuan et al. |
| 2011/0097889 A1 | 4/2011 | Yuan et al. |
| 2011/0140229 A1 | 6/2011 | Rachmady et al. |
| 2011/0175149 A1 | 7/2011 | Kim et al. |
| 2011/0198700 A1 | 8/2011 | Park et al. |
| 2012/0074386 A1 | 3/2012 | Rachmady et al. |
| 2012/0091538 A1 | 4/2012 | Lin et al. |
| 2012/0168830 A1 | 7/2012 | Usuda et al. |
| 2012/0319211 A1 | 12/2012 | van Dal et al. |
| 2013/0001591 A1 | 1/2013 | Wu et al. |
| 2013/0093026 A1 | 4/2013 | Wann et al. |
| 2013/0228830 A1 | 9/2013 | Lee et al. |
| 2013/0228876 A1 | 9/2013 | Mor et al. |
| 2013/0234203 A1 | 9/2013 | Tsai et al. |
| 2013/0256764 A1 | 10/2013 | Liaw |
| 2013/0277686 A1 | 10/2013 | Liu et al. |
| 2014/0027816 A1 | 1/2014 | Cea et al. |
| 2014/0042500 A1 | 2/2014 | Wann et al. |
| 2014/0138770 A1 | 5/2014 | van Dal et al. |
| 2014/0197493 A1 | 7/2014 | Tsai et al. |
| 2014/0203370 A1 | 7/2014 | Maeda et al. |
| 2014/0225065 A1 | 8/2014 | Rachmady et al. |
| 2014/0239354 A1 | 8/2014 | Huang et al. |
| 2014/0246731 A1 | 9/2014 | Chen et al. |
| 2014/0256105 A1 | 9/2014 | Wann et al. |
| 2014/0273360 A1 | 9/2014 | Cheng et al. |
| 2014/0299934 A1 | 10/2014 | Kim et al. |
| 2014/0353719 A1 | 12/2014 | Kim |
| 2014/0361336 A1 | 12/2014 | Chen et al. |
| 2014/0374827 A1 | 12/2014 | Suh et al. |
| 2014/0374838 A1 | 12/2014 | Chen et al. |
| 2014/0377922 A1 | 12/2014 | Fung |
| 2015/0028426 A1 | 1/2015 | Ching et al. |
| 2015/0054039 A1 | 2/2015 | Ching et al. |
| 2016/0329329 A1 | 11/2016 | Chen et al. |

FOREIGN PATENT DOCUMENTS

| | | |
|---|---|---|
| CN | 102832236 A | 12/2012 |
| KR | 20060062048 A | 6/2006 |
| KR | 1020070000758 A | 1/2007 |

PASSIVATED AND FACETED FOR FIN FIELD EFFECT TRANSISTOR

This application is a continuation of U.S. patent application Ser. No. 16/538,496, entitled "Passivated and Faceted for Fin Field Effect Transistor" filed on Aug. 12, 2019, which is a continuation of U.S. patent application Ser. No. 15/620,499, now U.S. Pat. No. 10,381,482 issued Aug. 13, 2019, entitled "Passivated and Faceted for Fin Field Effect Transistor" filed on Jun. 12, 2017, which is a continuation of U.S. patent application Ser. No. 15/018,245, now U.S. Pat. No. 9,680,021 issued Jun. 13, 2017, entitled "Passivated and Faceted for Fin Field Effect Transistor" filed on Feb. 8, 2016, which is a divisional of U.S. patent application Ser. No. 14/051,033, now U.S. Pat. No. 9,287,262 issued Mar. 15, 2016, entitled "Passivated and Faceted for Fin Field Effect Transistor" filed on Oct. 10, 2013, which applications are hereby incorporated herein by reference.

BACKGROUND

As the semiconductor industry has progressed into nanometer technology process nodes in pursuit of higher device density, higher performance, and lower costs, challenges from both fabrication and design issues have resulted in the development of three-dimensional designs, such as a fin field effect transistor (FinFET). A typical FinFET is fabricated with a thin vertical "fin" (or fin structure) extending from a substrate formed by, for example, etching away a portion of a silicon layer of the substrate. The channel of the FinFET is formed in this vertical fin. A gate is provided over (e.g., wrapping) the fin. Having a gate on both sides of the channel allows gate control of the channel from both sides. In addition, strained materials in source/drain (S/D) portions of the FinFET utilizing selectively grown silicon germanium (SiGe) may be used to enhance carrier mobility.

However, there are challenges to implementation of such features and processes in complementary metal-oxide-semiconductor (CMOS) fabrication. For example, interface traps between fins and shallow-trench-isolation (STI) oxide cause high leakage current of the FinFET, thereby degrading the device performance.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DESCRIPTION

Figure 1:
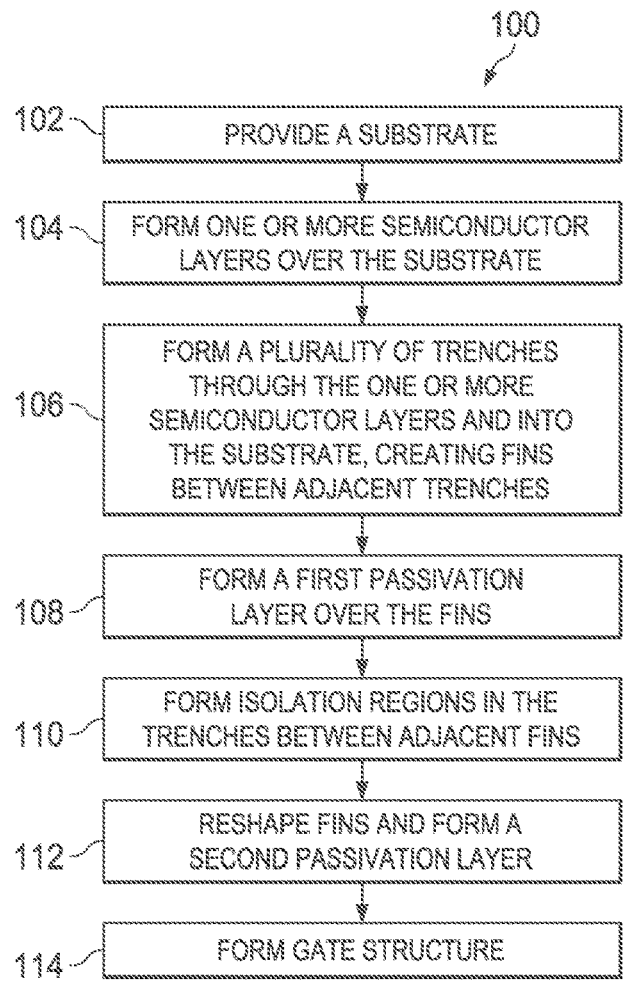
FIG. 1 is a flowchart illustrating a method of fabricating a FinFET according to various aspects of the present disclosure.

It is understood that the following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Referring to FIG. 1, illustrated is a flowchart of a method 100 of fabricating a fin field effect transistor (FinFET) according to various aspects of the present disclosure. The method 100 begins with step 102 in which a substrate, such as a silicon substrate, is provided. The method 100 continues with step 104 in which one or more semiconductor layers are formed over the substrate. In an embodiment, such as that disclosed below with reference to FIGS. 3-10, the one or more semiconductor layers comprise a silicon germanium epitaxially grown over the substrate and a germanium layer epitaxially grown over the silicon germanium layer. In another embodiment, such as that disclosed below with reference to FIGS. 11-18, a silicon germanium layer (gradient or uniform) is formed over the substrate. In yet another embodiment, such as that disclosed below with reference to FIGS. 19-26, the one or more semiconductor layers comprise a plurality of silicon germanium layers having differing concentrations of germanium.

In step 106, a plurality of trenches is formed through the one or more semiconductor layers and into the substrate, wherein fins are created between adjacent trenches. A first passivation layer, such as an oxynitride layer, is formed over the fins in step 108, followed by isolation regions being formed by depositing a dielectric material in the trenches in step 110. Exposed portions of the fins are reshaped and a second passivation layer, such as an oxynitride layer, is formed over the reshaped fins in step 112. Thereafter, a gate structure is formed in step 114. The discussion that follows illustrates embodiments of FinFETs that can be fabricated according to the method 100 of FIG. 1.

Figure 2:
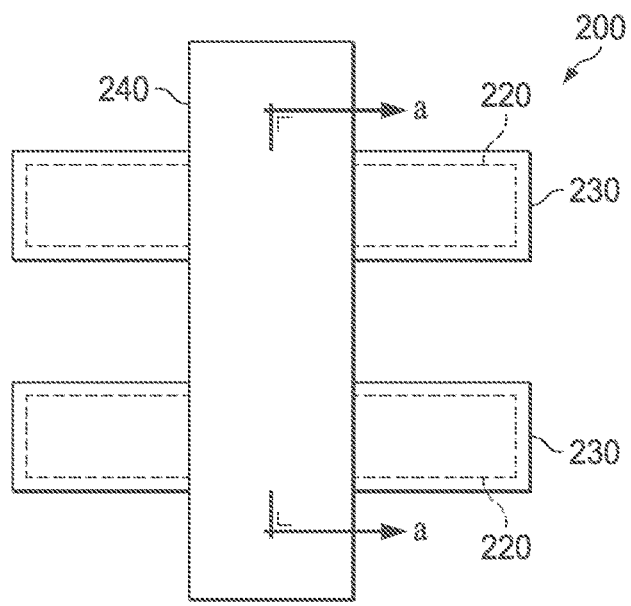
FIG. 2 shows a top view of a FinFET comprising a passivation structure according to various aspects of the present disclosure.

FIG. 2 shows a top view of a fin field effect transistor (FinFET) 200 comprising a passivation structure 230 formed over a fin structure 220 according to various aspects of the present disclosure. FIGS. 3-26 are cross-sectional views of a FinFET 200 taken along the line a-a of FIG. 2 at various stages of fabrication according to various embodiment of the present disclosure. As employed in the present disclosure, the FinFET 200 refers to any fin-based, multi-gate transistor. Other transistor structures and analogous structures are within the contemplated scope of the disclosure. The FinFET 200 may be included in a microprocessor, memory cell, and/or other integrated circuit (IC).

It is noted that the method of FIG. 1 does not produce a completed FinFET 200. A completed FinFET 200 may be fabricated using complementary metal-oxide-semiconductor (CMOS) technology processing. Accordingly, it is understood that additional processes may be provided before, during, and after the method 100 of FIG. 1, and that other processes may only be briefly described herein. Also, FIGS. 1-26 are simplified for a better understanding of the concepts of the present disclosure. For example, although the figures illustrate the FinFET 200, it is understood the IC may comprise a number of other devices comprising resistors, capacitors, inductors, fuses, etc.

FIG. 2 illustrates a FinFET 200 fabricated using the steps in FIG. 1. For illustration, the FinFET 200 comprises a fin structure 220 (dashed line), a passivation structure 230 surrounding the fin structure 220 and a gate structure 240 traversing over a channel portion of the fin structure 220. For illustration, the FinFET 200 comprises two fins. In some embodiments, the FinFET 200 may comprise less than or greater than two fins, for example, one fin or three fins.

Figure 3:
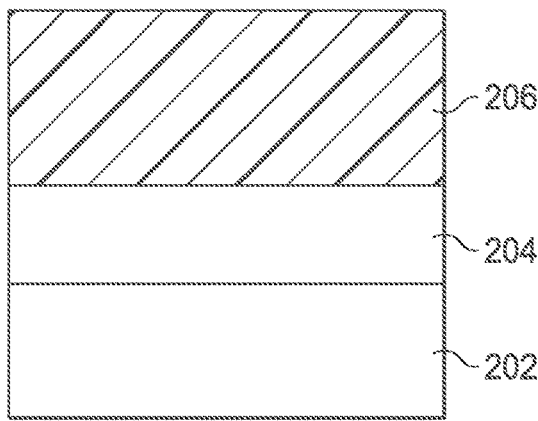
FIGS. 3-10 are cross-sectional views of a FinFET at various stages of fabrication according to various embodiments of the present disclosure.

FIGS. 3-10 illustrate various cross-sectional views of intermediate steps of fabricating a FinFET device in accordance with an embodiment. Referring first to FIG. 3 and step 102 in FIG. 1, a substrate 202 is provided, wherein the substrate 202 comprises a first semiconductor material having a first lattice constant and hence is also referred to as first semiconductor material 202 in the present disclosure. In one embodiment, the substrate 202 comprises a crystalline silicon substrate (e.g., wafer). In alternative embodiments, the substrate 202 comprises a silicon-on-insulator (SOI) structure. The substrate 202 may comprise various doped regions depending on design requirements (e.g., p-type substrate or n-type substrate). In some embodiments, the doped regions may be doped with p-type or n-type dopants. For example, the doped regions may be doped with p-type dopants, such as boron or $BF_2$; n-type dopants, such as phosphorus or arsenic; and/or combinations thereof. The doped regions may be configured for an n-type FinFET, or alternatively configured for a p-type FinFET.

Still referring to FIG. 3, a second semiconductor material 204 (such as silicon germanium layer 204) epitaxially grown over the silicon substrate 202 (step 104 in FIG. 1), wherein the second semiconductor material 204 has a second lattice constant greater than the first lattice constant. For example, in an embodiment, the substrate 202 may be a silicon wafer and the second semiconductor material 204 is a silicon germanium layer. In this example, the germanium layer has about 25% to about 75% germanium, and may have a strained or fully relaxed surface. Additionally, the second semiconductor material 204 may be a uniform layer having a uniform concentration of, for example, germanium, or a gradient layer wherein the concentration of, for example, germanium varies.

In an embodiment, the second semiconductor material 204 (such as silicon germanium layer) is selectively grown by a chemical vapor deposition (CVD) process, such as a low-pressure CVD (LPCVD). In one embodiment, the LPCVD process is performed at a temperature of about 350° C. to about 800° C. and under a pressure of about 1 mTorr to about 760 Torr, using, for example, $SiH_4$, $Si_2H_6$, or the like as a silicon precursor and $GeH_4$, $Ge_2H_6$, or the like as a germanium precursor. In some embodiments, the silicon germanium layer 204 has a thickness ranging from about 10 nm to about 50 nm.

Still referring to FIG. 3, a third semiconductor material 206 (such as a germanium layer) is epitaxially grown over the second semiconductor material 204 (step 104 in FIG. 1), wherein the third semiconductor material 206 has a third lattice constant greater than the second lattice constant. As such, the second lattice constant is between the first lattice constant and the third lattice constant. In an embodiment, the third semiconductor material 206 comprises a germanium layer selectively grown by an LPCVD process. In an embodiment, the LPCVD process is performed at a temperature of about 200° C. to about 700° C. and under a pressure of about 1 mTorr to about 760 Torr, using $GeH_4$ or $Ge_2H_6$ as a precursor. In some embodiments, the third semiconductor material 206 has a thickness ranging from about 10 nm to about 50 nm. In an embodiment, a surface of the third semiconductor material 206 is fully relaxed.

For convenience, the second semiconductor material 204 is also referred to herein as the silicon germanium layer 204, and the third semiconductor material 206 is also referred to herein as the germanium layer 206. It should be noted, however, that other embodiments may utilize other materials, such as other group III-V materials, SiC, and the like.

Figure 4:
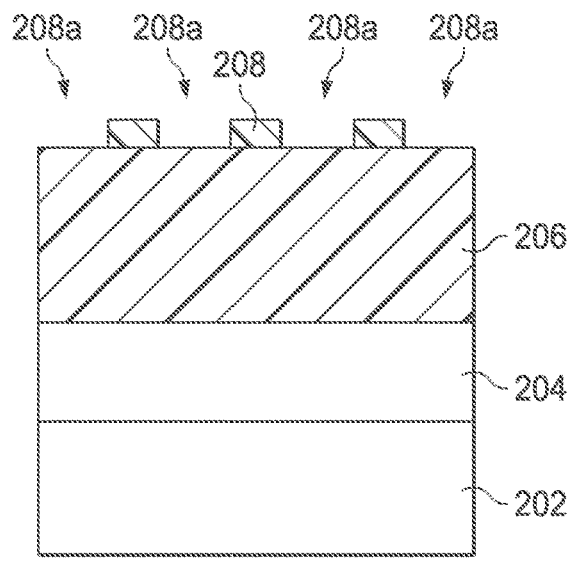
Figure 5:
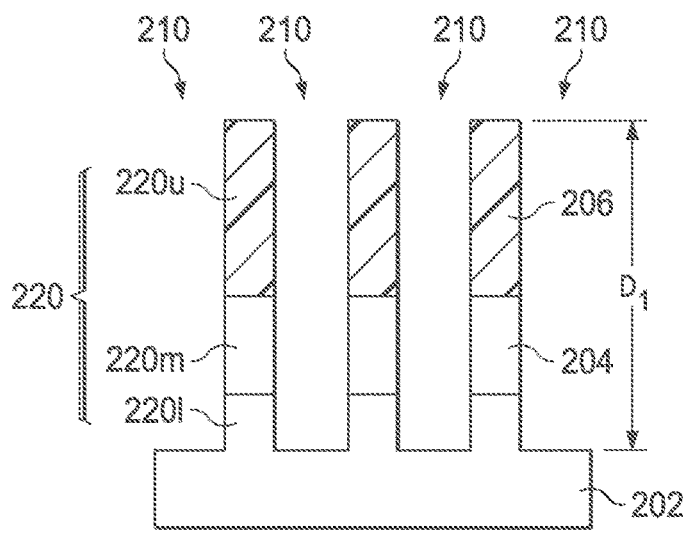

FIGS. 4-5 illustrate forming a plurality of trenches (such as trenches 210 in FIG. 5) into the substrate 202, the silicon germanium layer 204, and the germanium layer 206 in accordance with an embodiment, similar to that discussed above with reference to step 106 in FIG. 1. Referring first to FIG. 4, there is shown a patterned mask 208 defining openings 208a. In an embodiment, the patterned mask 208 is a photoresist layer that has been deposited, exposed, and developed. Other masking layers, such as oxide and/or nitride hard mask layers, may also be used.

The exposed germanium layer 206 is then etched to form a plurality of trenches 210. In some embodiments, the plurality of trenches 210 extends through the germanium layer 206, silicon germanium layer 204, and into the silicon substrate 202. In some embodiments, the trenches 210 may be strips (viewed from the top of the FinFET 200) parallel to each other, and closely spaced with respect to each other. In some embodiments, the trenches 210 may be continuous and surrounding the remaining germanium layer 206 and remaining silicon germanium layer 204. In some embodiments, the etching process may be performed using $CF_4$, HBr, $CH_3F$, $SF_6$, a mixture thereof, or the like as an etching gas, a carrier gas such as He or the like, and an passivation gas such as $O_2$ or the like. In an embodiment the process gas may be a combination of the etching gas, a carrier gas, and a passivation gas and may be used to etch the Ge, SiGe, and the Si material, although at different etch rates. In an embodiment, the trenches 210 may have a depth D1 of about 20 nm to about 120 nm.

In the depicted embodiments, the remaining germanium layer 206, remaining silicon germanium layer 204, and remaining silicon substrate 202 between trenches 210 are form a fin structure 220 (shown in FIG. 5). Further, the remaining germanium layer 206 is hereinafter referred to as an upper fin portion 220u. The remaining silicon germanium layer 204 is hereinafter referred to as a middle fin portion 220m. The protruding sections of the substrate 202 between trenches 210 are hereinafter referred to as a lower fin portion 220l.

As such, the fin structure 220 comprises a lower fin portion 220l comprising a first semiconductor material 202 having a first lattice constant; a middle fin portion 220m comprising a second semiconductor material 204 having a second lattice constant greater than the first lattice constant; and an upper fin portion 220u comprising a third semiconductor material 206 having a third lattice constant greater than the first lattice constant and the second lattice constant, wherein the middle fin portion 220m is between the lower fin portion 220l and upper fin portion 220u. In the depicted embodiment, there are three fins extending from the substrate 202.

The patterned mask 208 is removed and a cleaning process is performed. In an embodiment, an SPM clean comprising a dilute mixture of $H_2SO_4$ and $H_2O_2$ may be used. Additionally, a cleaning process using, for example, diluted hydrofluoric (DHF) acid may be performed to remove a native oxide of the silicon substrate 202.

The process steps up to this point have provided the substrate 202 having the trenches 210 surrounding the fin structure 220. Conventionally, by introducing a dielectric material, such as shallow-trench-isolation (STI) oxide, in the trenches 210, each fin of the fin structure 220 is isolated from neighboring fins. However, the step of forming the dielectric material may create interface traps between the fin and dielectric material. The generated interface traps may provide a carrier transportation path between the fin and the dielectric material and cause high leakage current of the FinFET, thereby degrading the device performance.

Accordingly, the processing discussed below forms a passivation structure on exposed surfaces of the fin structure 220 to impede generation of the interface traps between the fin and STI oxide. Problems associated with high leakage current due to high interface traps may be reduced and/or avoided. Thus, embodiments disclosed herein may achieve the desired device performance characteristics, such as low leakage.

Figure 6:
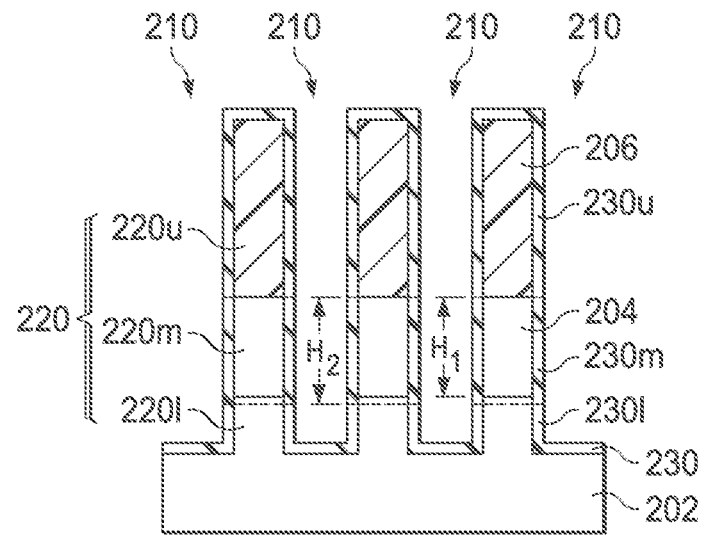

As depicted in FIG. 6, and discussed above with reference to step 108 in FIG. 1, a passivation structure is formed on exposed surfaces of the fin structure 220 to enhance device performance. In an embodiment, the passivation structure 230 is an oxynitride formed by an oxidation and nitridation process. As discussed above, the fin structure 220 may be formed of different materials, such as the silicon substrate 202, the silicon germanium layer 204 and the germanium layer 206. The oxidation and nitridation processes may react differently with these materials, forming, for example, a silicon oxynitride (SiON) layer on the silicon substrate 202, a silicon germanium oxynitride (SiGeON) on the silicon germanium layer 204, and a germanium oxynitride (GeON) on the germanium layer 206. The first passivation layer may have a thickness of about 0.5 nm to about 5 nm.

Accordingly, FIG. 6 illustrates a first passivation layer 230 comprising a lower passivation portion 230l over the silicon substrate 202, a middle passivation portion 230m over the silicon germanium layer 204, and an upper passivation portion 230u over the germanium layer 206. Due to the different materials, the lower passivation portion 230l over the silicon substrate 202 is a SiON layer, the middle passivation portion 230m over the silicon germanium layer 204 is a SiGeON layer, and the upper passivation portion 230u over the germanium layer 206 is a GeON layer.

As such, the first passivation layer 230 over the fin structure 220 comprises the lower passivation portion 230l over the lower fin portion 220l comprising an oxynitride of the first semiconductor material 202; the upper passivation portion 230u over the upper fin portion 220u comprises an oxynitride of the third semiconductor material 206; and the middle passivation portion 230m between the lower passivation portion 230l and upper passivation portion 230u, wherein the middle passivation portion 230m over the middle fin portion 220m comprises an oxynitride of the second semiconductor material 204.

The first passivation layer 230 acts as a buffer layer between the fin 220 and a subsequently formed insulating layer (such as STI oxide 216 in FIG. 8) to impede generation of the interface traps. Problems associated with high leakage current due to high interface traps may be reduced and/or avoided, thereby achieving better performance characteristics, such as low leakage.

In the depicted embodiment, the step of forming the first passivation layer 230 over the fin structure 220 is performed by an oxidation process, followed by a nitridation process. In some embodiments, the oxidation process comprises a rapid thermal oxidation (RTO) process, high pressure oxidation (HPO), chemical oxidation process, in-situ stream generation (ISSG) process, or enhanced in-situ stream generation (EISSG) process. In some embodiments, the RTO process is performed at a temperature of about 400° C. to about 700° C., using $O_2$ and $O_3$ as reaction gases, for about 1 second to about 30 seconds. In other embodiments, an HPO is performed using a process gas of $O_2$, $O_2+N_2$, $N_2$, or the like at a pressure from about 1 atm to about 25 atm and a temperature from about 300° C. to about 700° C. for about 1 minute to about 180 minutes. Examples of a chemical oxidation process include wet SPM clean, wet $O_3/H_2O$, or the like. The $O_3$ may have a concentration of about 1 ppm to about 50 ppm.

In some embodiments, the nitridation process comprises rapid thermal nitridation (RTN) process, high pressure nitridation (HPN), or decoupled plasma nitridation (DPN) process. In some embodiments, the RTN process is performed at a temperature of about 400° C. to about 800° C., using $NH_3$ as reaction gas, for about 1 second to about 180 seconds. In some embodiments, the HPN process is performed using a process gas of $NH_3$ at a pressure from about 1 atm to about 25 atm and a temperature from about 300° C. to about 700° C. for about 1 minute to about 180 minutes. In some embodiments, the DPN process is performed under a power of about 300 Watts to about 2250 Watts, using a process gas of $N_2$, $NH_3$, $N_2+Ar$, $N_2+He$, $NH_3+Ar$, or the like as process gases.

In some embodiments, a post nitridation anneal (PNA) process is performed after the DPN process. In some embodiments, the PNA is performed at a temperature of about 400° C. to about 700° C., using $N_2$ as anneal gas, for about 1 second to about 180 seconds. The PNA process causes the GeO to react with the N to reach a stable state, as well as driving the N deeper to create a more uniform layer.

The ratio of y:x (N:O) in the oxynitride layers (e.g., $SiO_xN_y$, $SiGeO_xN_y$, and $GeO_xN_y$) may be controlled through process condition adjustment, such as plasma power or temperature, for a particular application. In some embodiments, a ratio of y:x is between about 0.25 to about 0.90.

In some embodiments, some elements in the second semiconductor material 204 (such as germanium in the silicon germanium layer 204) may diffuse into the first semiconductor material 202 (such as the silicon substrate 202) during the nitridation process. As such, the middle passivation portion 230m may extend along a portion over the lower fin portion 220l. In some embodiments, a first height $H_1$ of the middle passivation portion 230m is equal to or greater than a second height $H_2$ of the middle fin portion 220m as illustrated in FIG. 6. In some embodiments, a ratio of the first height $H_1$ to the second height $H_2$ is from about 1 to about 1.2.

Figure 7:
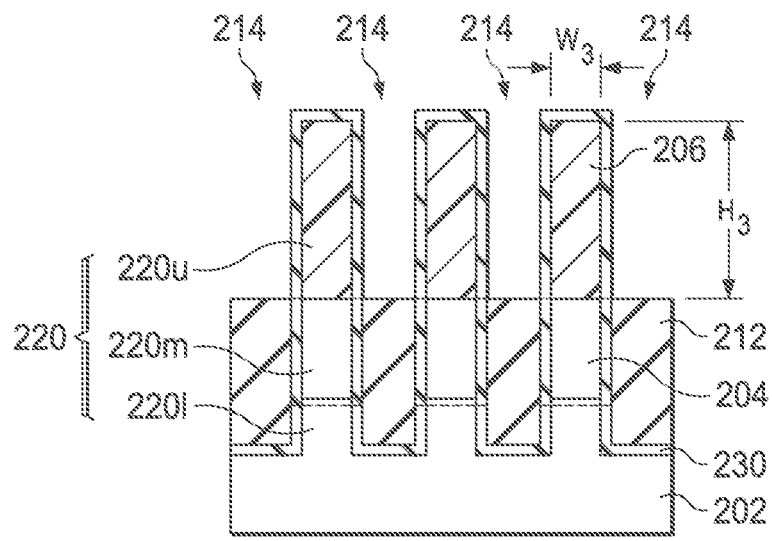

FIG. 7 depicts the resulting structure after forming a dielectric material 212 in the trenches 210, such as discussed above with reference to step 110 of FIG. 1. The dielectric material 212 may include silicon oxide, and hence is also referred to as STI oxide 212 in the present disclosure. In some embodiments, other dielectric materials, such as silicon nitride, silicon oxynitride, fluoride-doped silicate glass (FSG), or a low-K dielectric material, may also be used. In some embodiments, the STI oxide 212 may be formed using a spin-on-dielectric (SOD) process, such as hydrogen silsesquioxane (HSQ) or methyl silsesquioxane (MSQ). In other embodiments, the STI oxide 212 may be formed using a high-density-plasma (HDP) CVD process, using silane (SiH₄) and oxygen (O₂) as reacting precursors. In other embodiments, the STI oxide 212 may be formed using a sub-atmospheric CVD (SACVD) process or high aspect-ratio process (HARP), wherein process gases may comprise tetraethylorthosilicate (TEOS) and ozone (O₃).

In an embodiment, the STI oxide 212 is formed to a thickness greater than a height of the fins 220 and subsequently recessed using a planarization process and an etch process. The planarization process, such as a CMP, reduces the STI oxide 212 to an upper surface of the first passivation layer 230. A subsequent etch process reduces the height of the STI oxide 212 to expose portions of the sidewalls of the fin 220, resulting in recesses 214.

In some embodiments, the etching step may be performed using a wet etching process, for example, by dipping the substrate 202 in dilute hydrofluoric acid (HF). In some embodiments, the etching step may be performed using a vapor etching process, for example, the vapor etching process may be performed using HF as etching gas.

In an embodiment, the STI oxide 212 is recessed such that an upper surface of the STI oxide 212 is at or below an interface between the upper fin portion 220u and the middle fin portion 220m. In an embodiment, a height $H_3$ of the exposed fin is about 10 nm to about 50 nm, and width $W_3$ is about 6 nm to about 20 nm.

Figure 8:
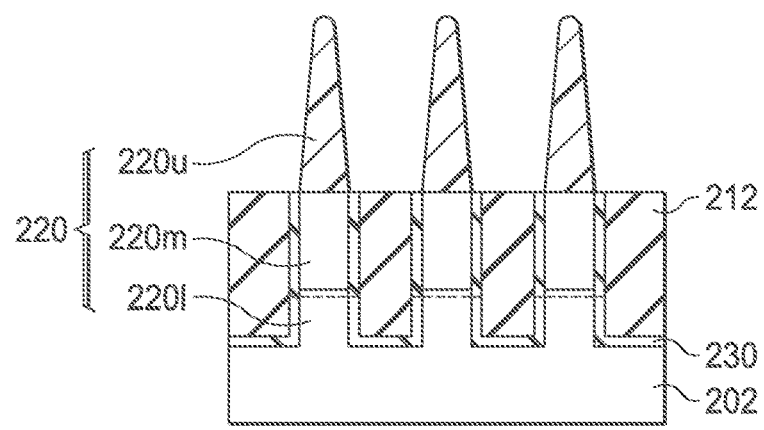

Referring now to FIG. 8, a fin reshaping process is performed in accordance with an embodiment, and as discussed above with reference to step 112 of FIG. 1. The reshaping process results in multiple crystal facets being exposed along a surface of the fin 220. For example, in an embodiment an upper surface of the fin 220 may have a crystal orientation of (001) and a sidewall of the fin 220 may have a crystal orientation of (110). Between these crystal orientations, the fin surface may also exhibit crystal orientations of (113) and (111). By reshaping the fin, higher mobility may be obtained as compared to unshaped fins. In an embodiment in which the upper fin portion 220u comprises germanium, the reshaping may be performed using a wet etch of hot ammonia at a temperature of 20° C. to about 100° C. Such an etch process removes the upper passivation portion 230u and reshapes the upper fin portion 220u. As a result of the reshaping process, exposed portions of the fin 220 exhibits slanted sidewalls.

Figure 9:
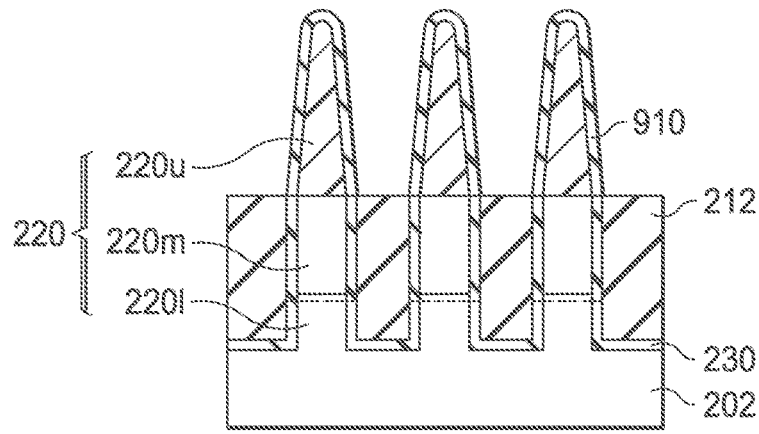

FIG. 9 illustrates a second passivation process in accordance with an embodiment, and as discussed above with reference to step 112 of FIG. 1. The second passivation process results in a second passivation layer 910 formed on exposed surfaces of the reshaped fin, the upper fin portion 220u in the illustrated embodiment. The second passivation process may use similar processes as the first passivation process discussed above with reference to FIG. 6. The second passivation layer 910 may have a thickness of about 0.5 nm to about 5 nm.

In some embodiments, the second passivation layer 910 comprises $GeO_xN_y$, wherein the ratio of y:x (N:O) is about 0.25 to about 0.9. A ratio such as this has been found to allow for a Dit (interface trap density—a measure of dangling bond concentration per cm²) of about 1E10/cm2, whereas without the second passivation layer the Dit may be less than 1E12, such as about 1E11.

Furthermore, the y:x ratio of the second passivation layer along a top surface of the upper fin portion 220u may be adjusted to be different from the y:x ratio of the second passivation layer along sidewalls of the upper fin portion 220u. The y:x ratio of the second passivation layer oxynitride may be controlled through process condition adjustment, such as plasma power or temperature. In some embodiments, a first ratio of y:x of the second passivation layer 910 along an upper surface of the upper fin portion 220u is equal to or greater than a second ratio of y:x of the second passivation layer 910 along sidewalls of the upper fin portion 220u. In some embodiments, a ratio of the first ratio to the second ratio is from about 1 to about 1.3. In some embodiments, a higher y:x ratio may result in a lower etching rate or lower thermal effect.

Figure 10:
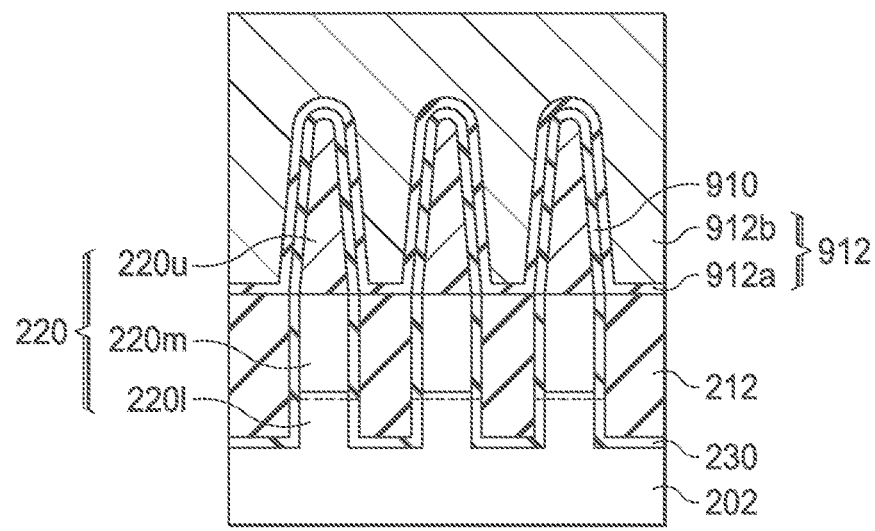

Thereafter, additional processes may be performed. For example, FIG. 10 illustrates a gate structure 912 formed over portions of the fin 220. Portions of the upper fin portion 220u comprise source/drain (S/D) regions along either side of the gate electrode 912b, and a channel region extends between the S/D regions below the gate electrode 912. In some embodiments, the gate structure 912 comprises a gate dielectric 912a and a gate electrode 912b as shown in FIG. 10.

As illustrated in FIG. 10 the first passivation layer and/or the second passivation layer over the fin structure 220 to impede generation of the interface traps between the fin 220 and STI oxide 212, or another overlying dielectric (e.g., an interlayer dielectric), problems associated with high leakage current due to high interface traps may be reduced and/or avoided, thereby resulting in increased device performance characteristics, such as low leakage.

It is understood that the FinFET 200 may undergo further processes. For example, CMOS processes may be performed to form various features such as contacts/vias, interconnect metal layers, dielectric layers, passivation layers, etc.

FIGS. 11-18 illustrate various intermediate process steps of another embodiment. As discussed above, FIGS. 3-10 illustrate an embodiment in which the fins 220 comprise a lower fin portion 220l, a middle fin portion 220m, and a upper fin portion 220u, wherein each has a different composition. As explained below FIGS. 11-18 illustrate an embodiment in which the fins will be formed of two different materials, rather than the three different materials as illustrated in FIGS. 3-10. Where appropriate, reference is made to the structures and processes described above, wherein like reference numerals refer to like elements unless otherwise noted.

Figure 11:
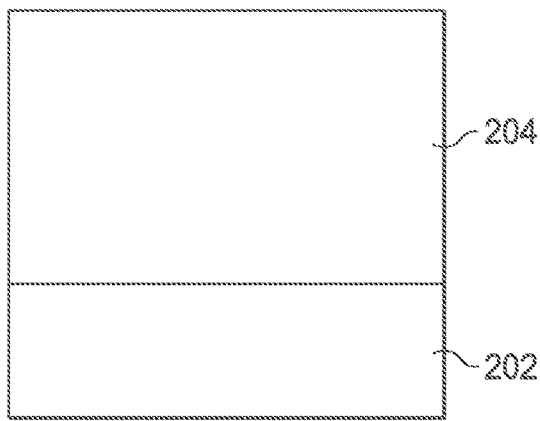
FIGS. 11-18 are cross-sectional views of a FinFET at various stages of fabrication according to various other embodiments of the present disclosure.

Referring first to FIG. 11, there is shown the substrate 202 having the second semiconductor material 204 (also referred to as the silicon germanium layer 204) formed thereon. As discussed above the substrate 202 may be formed of silicon and the second semiconductor material 204 may be formed of silicon germanium, wherein similar processes as described above with reference to FIG. 3 may be used.

In this embodiment, the silicon germanium layer 204 may be epitaxially grown to a thickness of about 20 nm to about 50 nm. The silicon germanium layer 204 may exhibit a strained surface and have a concentration of germanium from about 25% to about 75%.

Figure 12:
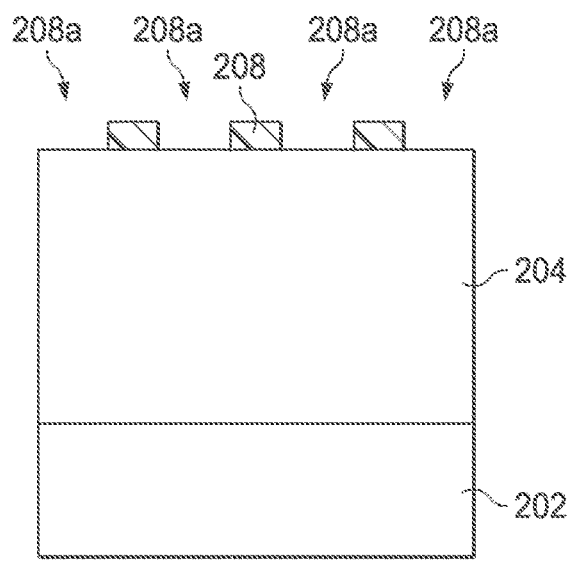
Figure 13:
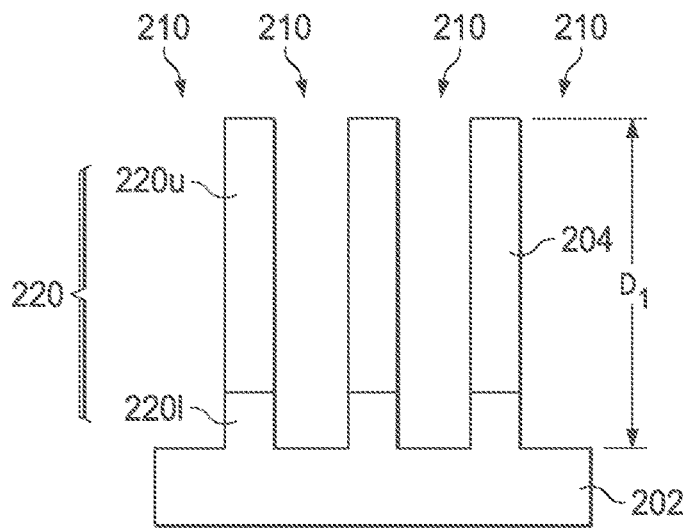

FIGS. 12 and 13 illustrate the patterning of the substrate 202 and the silicon germanium layer 204, thereby forming trenches 210 interposed between fins 220. In this embodiment as illustrated in FIG. 13, the fins 220 comprise a lower fin portion 220l and a upper fin portion 220u. In an embodiment, the lower fin portion 220l is formed from a silicon substrate and may be patterned in a similar manner as the lower fin portion 220l discussed above with reference to FIGS. 4 and 5, and the upper fin portion 220u is formed from a silicon germanium material and may be patterned in a similar manner as the middle fin portion 220m (formed also of silicon germanium) discussed above with reference to FIGS. 4 and 5. It is noted that for convenience, that FIGS. 13-18 refer to a upper fin portion 220u, although the material of the upper fin portion 220u may be different than the material of the upper fin portion 220u referred to in FIGS. 5-10. It is also noted that other materials may be used. In an embodiment a depth Di of the trench is about 20 nm to about 120 nm.

Figure 14:
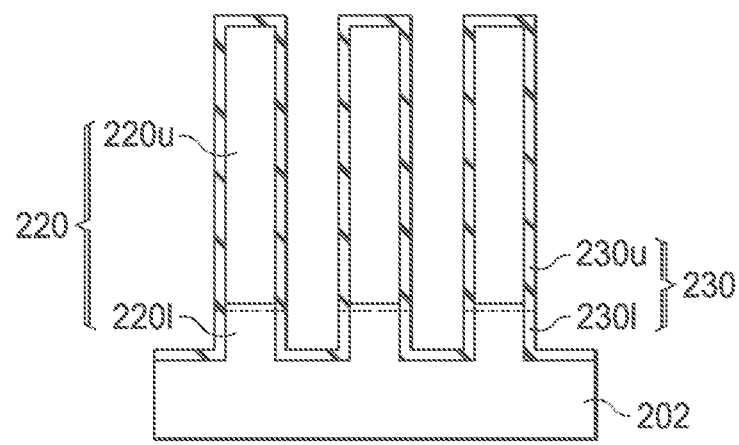

FIG. 14 illustrates a first passivation process to form a first passivation layer 230 in accordance with an embodiment. Similar processes as those disclosed above with reference to FIG. 6 may be used. In an embodiment, the first passivation layer 230 comprises an oxynitride. For example, in an embodiment in which the lower fin portion 220l comprises a silicon substrate, a lower passivation portion 230l may be formed of silicon oxynitride and in an embodiment in which the upper fin portion 220u comprises silicon germanium, an upper passivation portion 230u may be formed of silicon germanium oxynitride.

Figure 15:
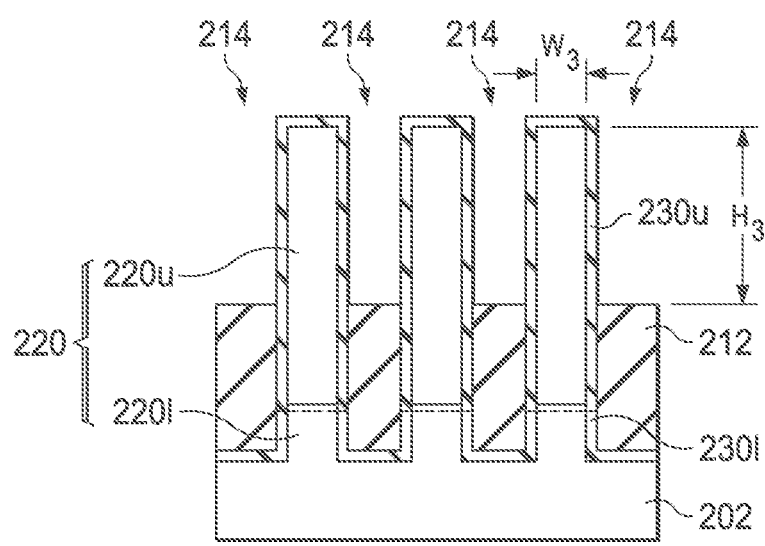

FIG. 15 illustrates forming an STI oxide 212 in the trenches 210 (see FIG. 14), creating recesses 214, in accordance with an embodiment. Similar processes as those disclosed above with reference to FIG. 7 may be used. In an embodiment, a height $H_3$ of the fin 220 above an upper surface of the STI oxide 212 is about 10 nm to about 50 nm, and a width $W_3$ of 6 nm to about 20 nm.

Figure 16:
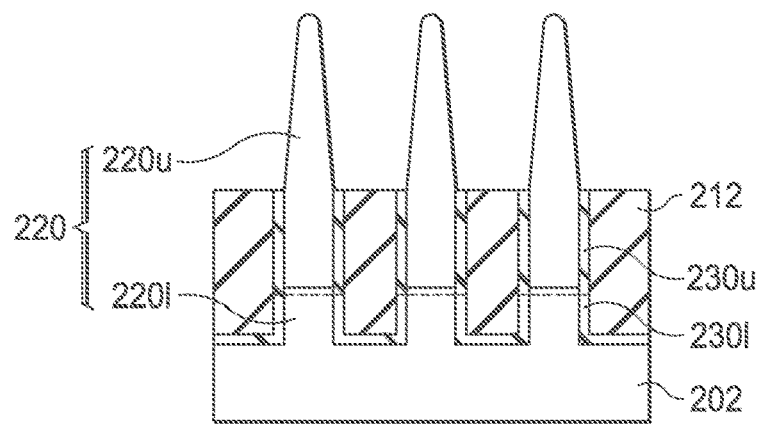
Figure 17:
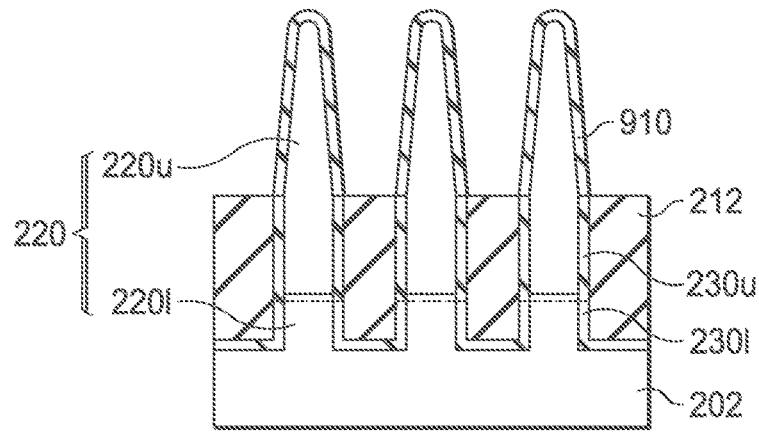

FIG. 16 illustrates a fin reshaping process and FIG. 17 illustrates a second passivation process to form a second passivation layer 910 in accordance with an embodiment. Similar processes as those disclosed above with reference to FIGS. 8 and 9 may be used.

Figure 18:
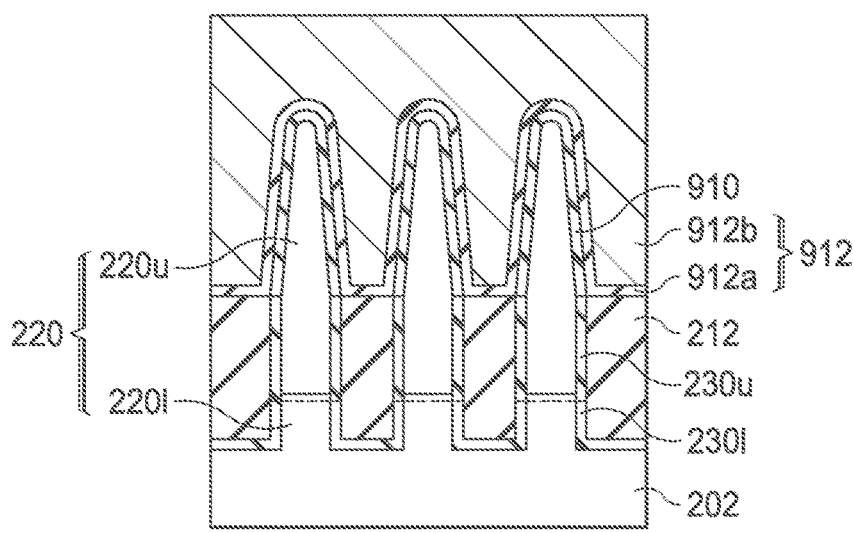

Thereafter, additional processes may be performed. For example, FIG. 18 illustrates a gate structure 912 formed over portions of the fin 220. Similar processes and structures may be used as discussed above with reference to FIG. 10.

FIGS. 19-26 illustrate various intermediate process steps of another embodiment. As discussed above, FIGS. 3-10 illustrate an embodiment in which the fins 220 comprise a lower fin portion 220l, a middle fin portion 220m, and an upper fin portion 220u, wherein each has a different composition, and FIGS. 11-18 illustrate an embodiment in which the fins 220 comprise a lower fin power 220l and a upper fin portion 220u. As explained below FIGS. 19-26 illustrate an embodiment in which the fins will be formed of two different materials wherein the elemental concentrations of one element varies, rather than the three different materials as illustrated in FIGS. 3-10 and two different materials as illustrated in FIGS. 11-18. Where appropriate, reference is made to the structures and processes described above, wherein like reference numerals refer to like elements unless otherwise noted.

Figure 19:
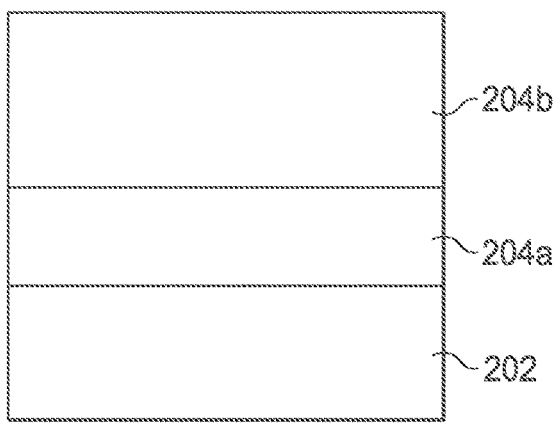
FIGS. 19-26 are cross-sectional views of a FinFET at various stages of fabrication according to various other embodiments of the present disclosure.

Referring first to FIG. 19, there is shown the substrate 202 having the second semiconductor material 204 (also referred to as the silicon germanium layer 204) formed thereon. As discussed above the substrate 202 may be formed of silicon and the second semiconductor material 204 may be formed of silicon germanium, wherein similar processes as described above with reference to FIG. 3 may be used.

In this embodiment, the silicon germanium layer 204 comprises a first silicon germanium layer ($Si_{x1}Ge_{y1}$) 204a and a second silicon germanium layer ($Si_{x2}Ge_{y2}$) 204b, wherein the relative concentrations of germanium differs between the first silicon germanium layer 204a and the second silicon germanium layer 204b. The first silicon germanium layer 204a may act as a buffer layer to the second germanium layer 204b to reduce defects and to control the strain in a surface of the second germanium layer 204b. In an embodiment, y1 is less than y2, thereby creating a compressive strain in a surface of the second germanium layer 204b. In an embodiment, y2 is less than y1, thereby creating a tensile strain in a surface of the second germanium layer 204b.

In an embodiment, the first silicon germanium layer 204a may be epitaxially grown to a thickness of about 20 nm to about 50 nm and the second silicon germanium layer 204b may be epitaxially grown to a thickness of about 20 nm to about 50 nm.

Figure 20:
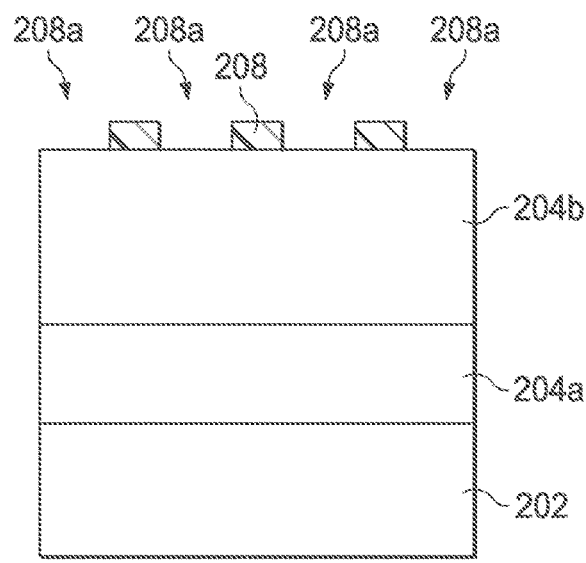
Figure 21:
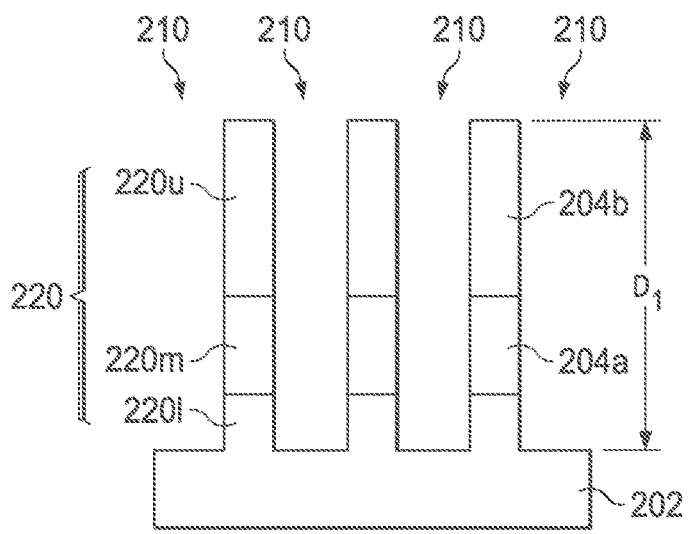

FIGS. 20 and 21 illustrate the patterning of the substrate 202, the first silicon germanium layer 204a and the second silicon germanium layer 204b, thereby forming trenches 210 interposed between fins 220. In the illustrated embodiment, the fins 220 comprises a lower fin portion 220l, a middle fin portion 220m, and a upper fin portion 220u, formed from the substrate 202, the first silicon germanium layer 204a and the second silicon germanium layer 204b, respectively. It is noted that for convenience, that FIGS. 21-26 refer to a middle fin portion 220m and a upper fin portion 220u, although the material of the middle fin portion 220m and the upper fin portion 220u of FIGS. 21-26 may be different than the material of the middle fin portion 220m and the upper fin portion 220u referred to in FIGS. 5-10. In an embodiment in which the substrate 202 is a silicon substrate, the substrate 202 may be etched as discussed above with reference to FIGS. 4 and 5. In an embodiment in which the first silicon germanium layer 204a and the second silicon germanium layer 204b are formed of silicon germanium, the first silicon germanium layer 204a and the second silicon germanium layer 204b may be etched in a similar manner as the silicon germanium layer discussed above with reference to FIGS. 4 and 5. In an embodiment a depth D1 of the trench is about 20 nm to about 120 nm.

Figure 22:
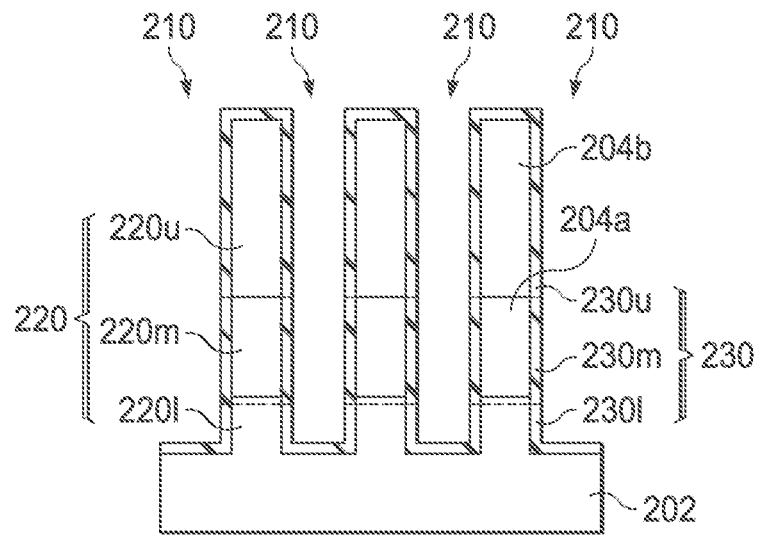

FIG. 22 illustrates a first passivation process to form a first passivation layer 230 in accordance with an embodiment. Similar processes as those disclosed above with reference to FIG. 6 may be used. In this embodiment, the first passivation process results in a lower passivation portion 230l, a middle passivation portion 230m, and an upper passivation portion 220u, although the middle passivation portion 230m and the upper passivation portion 230u of this embodiment may correspond to different materials than the middle passivation portion 230m and the upper passivation portion 230u of FIG. 6. In this embodiment, the concentration of Ge in the SiGeON layer may vary according to the concentration of Ge in the first silicon germanium layer 204a and the second silicon germanium layer 204b. For example, the upper passivation portion 220u over the first silicon germanium layer 204a may be expressed as $Si_{x1}Ge_{y1}ON$ and the middle passivation portion 220u over the second silicon germanium layer 204b may be expressed as $Si_{x2}Ge_{y2}ON$.

Figure 23:
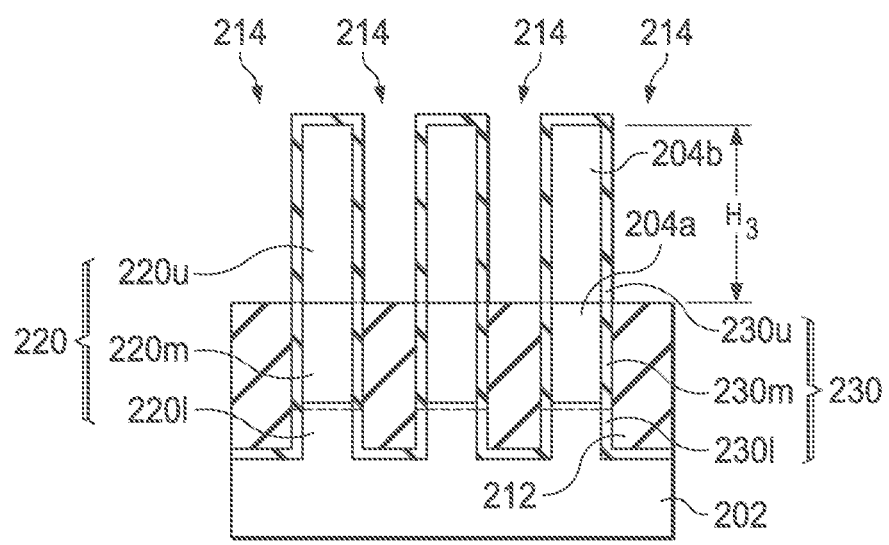

FIG. 23 illustrates forming an STI oxide 212 in the trenches 210 (see FIG. 22), creating recesses 214, in accordance with an embodiment. Similar processes as those disclosed above with reference to FIG. 7 may be used. In an embodiment, a height $H_3$ of the fin 220 above an upper surface of the STI oxide is about 20 nm to about 50 nm.

Figure 24:
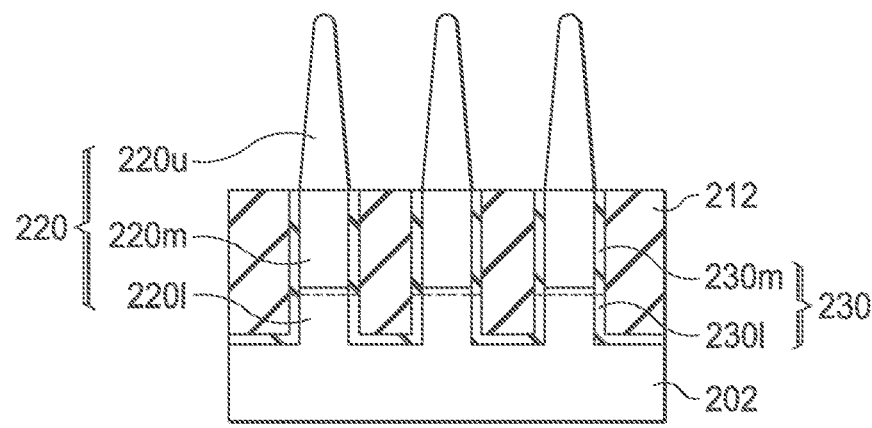
Figure 25:
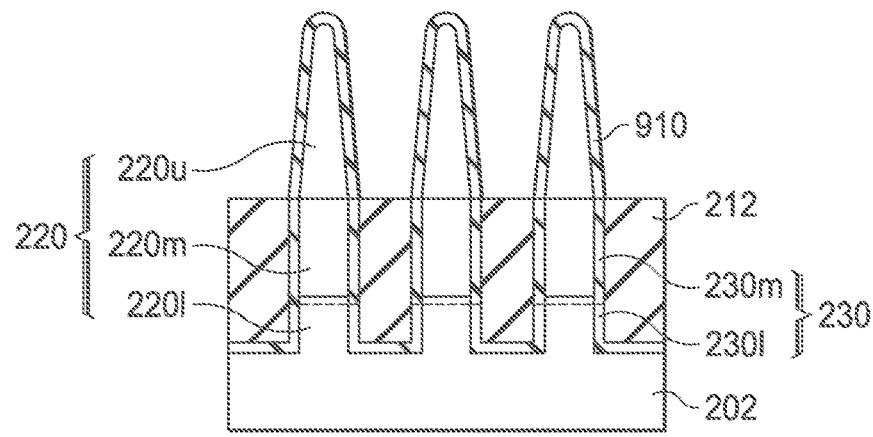

FIG. 24 illustrates a fin reshaping process and FIG. 25 illustrates a second passivation process to form a second passivation layer 910 in accordance with an embodiment. Similar processes as those disclosed above with reference to FIGS. 8 and 9 may be used.

Figure 26:
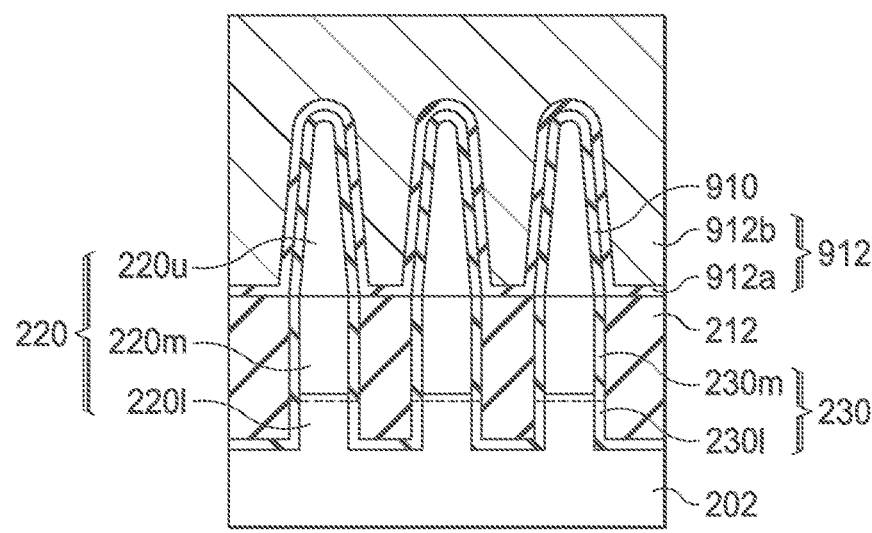

Thereafter, additional processes may be performed. For example, FIG. 26 illustrates a gate structure 912 formed over portions of the fin 220. Similar processes and structures may be used as discussed above with reference to FIG. 10.

The embodiments discussed above may be selected for a particular application. For example, an embodiment utilizing a Ge fin may be better suited for an N-FET, whereas SiGe may be better suited for a P-FET. Particular embodiments may be selected to achieve the desired strain and defect control. Furthermore, the percentage of Ge in SiGe may be adjusted to obtain the desired strain.

In an embodiment, a FinFET is provided. The FinFET comprises a substrate and a fin structure protruding from the substrate, the fin structure comprising one or more semiconductor layers, each of the semiconductor layers having a different lattice constant of a corresponding immediately underlying layer. An isolation region is adjacent opposing sidewalls of the fin structure, the fin structure having an upper portion extending above the isolation region, the upper portion having slanted sidewalls. A first passivation layer is interposed between the fin structure and the isolation region, and a second passivation layer is on the upper portion of the fin structure. A gate structure overlies the upper portion of the fin structure. The fin structure may comprise, for example, a silicon germanium layer on a silicon substrate and a germanium layer on the silicon germanium layer. In other embodiments, the fin structure may comprise a silicon germanium layer on a silicon substrate. In in yet other embodiments, the fin structure may comprise multiple silicon germanium layers having different germanium concentrations on a silicon substrate.

In yet other embodiments, a method of forming a FinFET is provided. The method includes providing a substrate and forming one or more fins extending from the substrate, each of the one or more fins having one or more semiconductor layers overlying the substrate, each of the one or more fins having a lattice constant different than a lattice constant of an underlying layer. A first passivation layer is formed over the one or more fins, and isolation regions are formed along opposing sidewalls of the one or more fins such that the one or more fins extending above an uppermost surface of the isolation regions. A reshaping process is performed on exposed portions of the one or more fins, and a second passivation layer is formed over the reshaped exposed portions of the one or more fins.

In yet still other embodiments, a FinFET is provided. The FinFET includes a substrate, a fin structure protruding from the substrate, the fin structure comprising one or more semiconductor layers, each of the semiconductor layers having a different lattice constant of an immediately underlying layer, and an isolation region adjacent opposing sidewalls of the fin structure, the fin structure having an upper portion extending above the isolation region, the upper portion having slanted sidewalls. The FinFET further includes a first passivation layer interposed between the fin structure and the isolation region and a second passivation layer on the upper portion of the fin structure. A gate structure overlies the upper portion of the fin structure.

In yet still other embodiments, a FinFET is provided. The FinFET includes a substrate having a fin structure, the fin structure comprising one or more semiconductor layers, each of the semiconductor layers having a different lattice constant of an immediately underlying layer, the fin structure having a lower portion and an upper portion, the upper portion having a lesser slope than the lower portion and an isolation region adjacent opposing sidewalls of the fin structure, an upper surface of the isolation region being level with a junction between the upper portion and the lower portion. The FinFET further includes a first passivation layer interposed between the fin structure and the isolation region and a second passivation layer on the upper portion of the fin structure. A gate structure overlies the upper portion of the fin structure.

In yet still other embodiments, a FinFET is provided. The FinFET includes a fin structure comprising one or more semiconductor layers, each overlying semiconductor layer of the one or more semiconductor layers having a different lattice constant of a corresponding immediately underlying semiconductor layer of the one or more semiconductor layers, the fin structure having a lower portion and an upper portion. The FinFET further includes a first passivation layer along sidewalls of the lower portion of the fin structure, an isolation region over the first passivation layer along opposing sidewalls of the fin structure, and a second passivation layer on sidewalls of the upper portion of the fin structure, an interface between the first passivation layer and the second passivation layer being aligned with an upper surface of the isolation region. A gate dielectric layer overlies the second passivation layer, and a gate electrode overlies the gate dielectric layer.

While the disclosure has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method of forming a fin field effect transistor (FinFET), the method comprising:
    forming a first fin extending from a substrate, the first fin having one or more semiconductor layers overlying the substrate, each of the one or more semiconductor layers having a lattice constant different than a lattice constant of an underlying layer, wherein an uppermost semiconductor layer of the one or more semiconductor layers comprises a germanium-containing semiconductor material;
    forming a first passivation layer over the first fin, wherein the first passivation layer over the uppermost semiconductor layer comprises an oxynitride of the germanium-containing semiconductor material;
    after forming the first passivation layer, forming isolation regions along opposing sidewalls of the first fin;
    removing the first passivation layer above an upper surface of the isolation regions, the first fin extending above an uppermost surface of the isolation regions and an upper surface of the first passivation layer;
    etching portions of the first fin extending above the upper surface of the isolation regions to form a reshaped portion of the first fin, wherein after the etching, sidewalls of the first fin above the first passivation layer have a different slope than sidewalls of the first fin adjacent the first passivation layer;
    forming a second passivation layer over the reshaped portion of the first fin, wherein the second passivation layer over the reshaped portion of the first fin comprises an oxynitride of the germanium-containing semiconductor material; and
    forming a gate structure over the second passivation layer.

2. The method of claim 1, wherein the germanium-containing semiconductor material is germanium layer.

3. The method of claim 2, wherein the germanium layer is on a silicon germanium layer.

4. The method of claim 2, wherein the second passivation layer is germanium oxynitride.

5. The method of claim 4, wherein the germanium oxynitride is $GeO_xN_y$, having a ratio of y:x (N:O) in a range from 0.25 to 0.9.

6. The method of claim 1, wherein the gate structure comprises a gate dielectric.

7. The method of claim 1, wherein a width of the first fin at a bottom of the second passivation layer is in a range from 6 nm to 20 nm.

8. A method of forming a fin field effect transistor (FinFET), the method comprising:
   forming a first passivation layer over a fin on a substrate, wherein the fin comprises a plurality of semiconductor layers having different lattice structures, wherein the plurality of semiconductor layers comprises a first semiconductor layer, wherein the first semiconductor layer comprises a germanium-containing semiconductor material, wherein the first passivation layer comprises an oxynitride of the germanium-containing semiconductor material;
   after forming the first passivation layer, forming an isolation region along a sidewall of the fin, an upper portion of the fin extending above an upper surface of the isolation region, wherein the upper portion comprises the first semiconductor layer;
   after forming the isolation region, reshaping the upper portion of the fin to form a reshaped portion of the fin, wherein after the reshaping a sidewall of the upper portion of the fin extends away from the upper surface of the isolation region at a different angle than a sidewall of a lower portion of the fin extends away from the upper surface of the isolation region;
   forming a second passivation layer over the reshaped portion of the fin, wherein the second passivation layer comprises an oxynitride of the germanium-containing semiconductor material; and
   forming a gate structure over the reshaped portion of the fin.

9. The method of claim 8, wherein the second passivation layer has a thickness in a range from 0.5 nm to 5 nm.

10. The method of claim 8, wherein the second passivation layer comprises $GeO_xN_y$.

11. The method of claim 8, wherein the second passivation layer has a first ratio of y:x along a top surface of the fin and a second ratio of y:x along a sidewall of the fin, wherein the first ratio is different than the second ratio.

12. The method of claim 11, wherein the first ratio is greater than the second ratio.

13. The method of claim 11, wherein a ratio of the first ratio to the second ratio is in a range from 1 to 1.3.

14. The method of claim 12, wherein forming the second passivation layer comprises a plasma process.

15. A method of forming a fin field effect transistor (FinFET), the method comprising:
   forming a fin over a substrate, the fin having at least one semiconductor layer having a different lattice constant than a lattice constant of the substrate, wherein the at least one semiconductor layer comprises an upper layer comprising a germanium-containing semiconductor material;
   forming a first passivation layer over the fin, wherein the first passivation layer over the at least one semiconductor layer comprises an oxynitride of the germanium-containing semiconductor material;
   after forming the first passivation layer, forming isolation regions along opposing sidewalls of the fin, an exposed portion of the fin being free of the isolation regions;
   performing an etch process on the exposed portion of the fin to form a reshaped upper portion of the fin, wherein sidewalls of the reshaped upper portion of the fin are tapered such that a width of the reshaped upper portion of the fin decreases as the fin extends away from the isolation regions; and
   forming a gate structure over the reshaped upper portion of the fin.

16. The method of claim 15, further comprising forming a second passivation layer on the reshaped upper portion of the fin, the second passivation layer being an oxynitride having a different ratio of nitrogen to oxygen on an upper surface of the reshaped upper portion of the fin than along a sidewall of the reshaped upper portion of the fin.

17. The method of claim 16, wherein forming the gate structure comprises forming a gate dielectric layer directly on the second passivation layer.

18. The method of claim 16, wherein the second passivation layer is a germanium oxynitride layer, wherein the germanium oxynitride layer directly contacts a silicon germanium oxynitride passivation layer along a lower portion of the fin.

19. The method of claim 15, wherein forming the fin comprises forming the upper layer directly on a silicon germanium layer.

20. The method of claim 15, wherein performing the etch process removes the first passivation layer above an upper surface of the isolation regions.

* * * * *